(12) United States Patent
Chen et al.

(10) Patent No.: US 10,347,795 B2
(45) Date of Patent: Jul. 9, 2019

(54) LIGHT EMITTING DIODE PACKAGE STRUCTURE WITH LARGE LUMINOUS INTENSITY IN PARTICULAR DIRECTIONS AND MANUFACTURING METHOD THEREOF

(71) Applicant: Everlight Electronics Co., Ltd., New Taipei (TW)

(72) Inventors: Yu-Hsuan Chen, New Taipei (TW); Ming-Kuei Wu, New Taipei (TW)

(73) Assignee: Everlight Electronics Co., Ltd., New Taipei (TW)

( * ) Notice: Subject to any disclaimer, the term of this patent is extended or adjusted under 35 U.S.C. 154(b) by 0 days.

(21) Appl. No.: 15/378,272

(22) Filed: Dec. 14, 2016

(65) Prior Publication Data
US 2017/0170368 A1 Jun. 15, 2017

(30) Foreign Application Priority Data
Dec. 14, 2015 (TW) .............................. 104141914 A

(51) Int. Cl.
| | |
|---|---|
| *H01L 33/44* | (2010.01) |
| *H01L 33/48* | (2010.01) |
| *H01L 33/54* | (2010.01) |
| *H01L 33/58* | (2010.01) |

(52) U.S. Cl.
CPC ............ *H01L 33/486* (2013.01); *H01L 33/44* (2013.01); *H01L 33/54* (2013.01); *H01L 33/58* (2013.01);
(Continued)

(58) Field of Classification Search
CPC ....... H01L 33/486; H01L 33/44; H01L 33/54; H01L 2933/0091; H01L 33/58; H01L 2933/005; H01L 2933/0033; H01H 13/023
See application file for complete search history.

(56) References Cited

U.S. PATENT DOCUMENTS

| | | | |
|---|---|---|---|
| 7,919,789 B2 * | 4/2011 | Chang | H05K 1/021 257/918 |
| 2004/0051118 A1 | 3/2004 | Bruhns et al. | |

(Continued)

FOREIGN PATENT DOCUMENTS

| | | |
|---|---|---|
| CN | 101452986 A | 6/2009 |
| EP | 1 403 937 A2 | 3/2004 |

(Continued)

OTHER PUBLICATIONS

Extended European Search Report, dated Feb. 13, 2017, in a counterpart EP application, No. EP 16203599.2.
Chinese Office Action, dated Feb. 2, 2019 in a counterpart Chinese patent application, No. CN 201611145257.1.

*Primary Examiner* — Mohsen Ahmadi
*Assistant Examiner* — Scott E Bauman
(74) *Attorney, Agent, or Firm* — Chen Yoshimura LLP

(57) ABSTRACT

A light emitting diode package structure including a base, a light emitting diode and an encapsulant is provided. The light emitting diode is disposed on a surface of the base and is adapted to generate and emit a light. The encapsulant is disposed on the base and encapsulates the light emitting diode. The encapsulant has a surface parallel to the surface of the base and a plurality of surfaces perpendicular to the surface of the base. The light, after passing through the surface of the encapsulant parallel to the surface of the base, has a first light intensity. The light, after passing through the surfaces of the encapsulant perpendicular to the surface of the base, has a second light intensity. The first light intensity is greater than the second light intensity. In addition, a manufacturing method of a light emitting diode package structure is also provided.

8 Claims, 4 Drawing Sheets

(52) U.S. Cl.
CPC ............... *H01L 2933/005* (2013.01); *H01L 2933/0033* (2013.01); *H01L 2933/0091* (2013.01)

(56) References Cited

U.S. PATENT DOCUMENTS

| | | | |
|---|---|---|---|
| 2004/0061440 A1* | 4/2004 | Imai | G02B 6/0028 |
| | | | 313/512 |
| 2006/0079082 A1 | 4/2006 | Bruhns et al. | |
| 2008/0128738 A1* | 6/2008 | Su | H01L 33/642 |
| | | | 257/99 |
| 2011/0001148 A1* | 1/2011 | Sun | H01L 33/60 |
| | | | 257/88 |
| 2013/0256711 A1* | 10/2013 | Joo | H01L 33/486 |
| | | | 257/88 |
| 2014/0319562 A1 | 10/2014 | Li et al. | |
| 2018/0358520 A1* | 12/2018 | Moon | H01L 33/50 |

FOREIGN PATENT DOCUMENTS

| | | |
|---|---|---|
| JP | 2006-032804 A | 2/2006 |
| JP | 2006-261286 A | 9/2006 |
| TW | 200417054 A | 9/2004 |
| TW | I283491 B | 7/2007 |
| TW | 200940868 A | 10/2009 |

\* cited by examiner

LIGHT EMITTING DIODE PACKAGE STRUCTURE WITH LARGE LUMINOUS INTENSITY IN PARTICULAR DIRECTIONS AND MANUFACTURING METHOD THEREOF

CROSS-REFERENCES TO RELATED APPLICATIONS

This application claims priority to Taiwan Patent Application No. 104141914 filed on Dec. 14, 2015, which is incorporated by reference in its entirety.

TECHNICAL FIELD

The present disclosure relates to a package structure and manufacturing methods thereof and, more particularly, to a light emitting diode (LED) package structure and manufacturing methods thereof.

BACKGROUND

Light emitting diodes (LEDs) are a type of light emitting components composes of semiconductor materials from elements of the III-V group. As LEDs generally have advantages such as long life, small size, high shock resistance, low heat generation and low power consumption, they have been widely used in household equipment and a variety of indicators or light sources. In recent years, a trend of development of LEDs has been towards multi-color and high brightness, and accordingly the application of LEDs has extended to the fields of large-scale outdoor billboards, traffic lights and related fields. In the future, LEDs may become a primary type of light source with energy saving and environmental friendly features, and thus may be widely used in various decorative or indicative lighting applications.

For example, LED package structure may be installed in buttons of an electronic device to enable the buttons to emit light. This feature facilitates operation of the buttons of the electronic device in the dark by a user or enhances the aesthetics of the electronic device due to the emitted light. In this example, the ability of the LED package structure to control the intensity of light emitted in each direction is important, especially in view of the need to efficiently transmit the light emitted by the LED package structure to provide good lighting capacity for the buttons.

SUMMARY

The present disclosure provides a LED package structure with large luminous intensity in one or more particular directions.

An LED package structure in accordance with the present disclosure may include a base, an LED disposed on a first surface of the base and capable of emitting a light, and an encapsulant disposed on the first base and encapsulating the LED. The encapsulant may include a second surface parallel to the first surface of the base and a plurality of third surfaces perpendicular to the first surface of the base. The light may have a first light intensity after passing through the second surface of the encapsulant parallel to the first surface of the base. The light may have a second light intensity after passing through the third surfaces of the encapsulant perpendicular to the first surface of the base. The first light intensity may be greater than the second light intensity.

In one embodiment, the LED package structure may also include a cover member disposed on at least one of the plurality of third surfaces of the encapsulant perpendicular to the first surface of the base. The light may have a third light intensity after passing through the cover member. The third light intensity may be less than the second light intensity.

In one embodiment, the LED package structure may also include a cover member disposed on at least one fourth surface of the LED perpendicular to the first surface of the base and one of the third surfaces of the encapsulant. The light may have a third light intensity after passing through the cover member. The third light intensity may be less than the second light intensity.

In one embodiment, the LED package structure may also include a cover member disposed on at least one fourth surface of the LED perpendicular to the first surface of the base. The light may have a third light intensity after passing through the cover member. The third light intensity may be less than the second light intensity.

In one embodiment, the cover member may be formed by spraying, sputtering, die stamping or sand polishing.

In one embodiment, the cover member may be composed of a plastic material or a filler material. The filler material may account for more than 50% of the overall weight percentage concentration of the cover member, and preferably more than 70%. The filler material may include at least refractive element(s) and reflective particles, thereby further refracting the light transmitted through the encapsulant. Accordingly, a light transmittance of the cover element may be lower than a light transmittance of the encapsulant.

In one embodiment, one end of the cover member may at least partially cut into the surface of the base. Moreover, a material of the cover member may be the same as or different from a material of the base.

In one embodiment, the LED package structure may be composed of a gallium nitride-based semiconductor chip. The semiconductor chip may include structure of a light emitting layer. After the semiconductor chip is disposed on the surface of the base, the light emitting layer may be perpendicular to the cover member. Additionally, a length and a width of the semiconductor chip may be different, and a thickness of the semiconductor chip may be greater than one half of a length of a shorter side thereof. Thus, the design of the LED package structure may efficiently enhance the first light intensity to be greater than the second light intensity or the third light intensity.

In addition, the gallium nitride-based semiconductor chip may also include a sapphire base or substrate. To avoid a phenomenon of uneven light cover due to differences between the first, second and third light intensities being relatively large, outer sides of the sapphire substrate may be patterned to form a cross section of irregularities to increase the second light intensity and the third light intensity.

Other than reducing the differences between the light intensities by patterning the substrate, a distance between the gallium nitride-based semiconductor chip and the cover member may be controlled to reduce the difference between the first light intensity and the third light intensity. For instance, the side of the gallium nitride-based semiconductor chip nearest the cover member may be configured to be no more than one half of the length of the shorter side of the chip. Accordingly, the thickness of the LED package structure may be reduced, and the difference between the first light intensity and the third light intensity may also be reduced.

In one embodiment, the light having the first light intensity, the light having the second light intensity, and the light having the third light intensity may be in directions that are mutually perpendicular.

In one embodiment, the above-described LED may be disposed on a surface of the base or on a pad. In the proposed design, it would be difficult for the LED to dissipate heat via through holes for conductive wires or terminals. Thus, in selecting the material for the cover member, it is preferable to select a thermosetting material to avoid deformation of the cover member caused by heat. Also preferably, the cover member may be filled with particles to enhance its efficiency in heat transfer, and the material for the particles may be ceramics such as $TiO_2$, $SiO_2$ or $Al_2O_3$.

In one embodiment, the aforementioned particles, filled in the cover member, may include a phosphorous material. The phosphorous material may be composed of one or more of the following: $Sr_5(PO_4)_3Cl:Eu^{2+}$, $(Sr,Ba)MgAl_{10}O_{17}:Eu^{2+}$, $(Sr,Ba)_3MgSi_2O_8:Eu^{2+}$, $SrAl_2O_4:Eu^{2+}$, $SrBaSiO_4:Eu^{2+}$, $CdS:In$, $CaS:Ce^{3+}$, $Y_3(Al,Gd)_5O_{12}:Ce^{2+}$, $Ca_3Sc_2Si_3O_{12}:Ce^{3+}$, $SrSiON:Eu^{2+}$, $ZnS:Al^{3+},Cu^+$, $CaS:Sn^{2+}$, $CaS:Sn^{2+},F$, $CaSO_4:Ce^{3+},Mn^{2+}$, $LiAlO_2:Mn^{2+}$, $BaMgAl_{10}O_{17}:Eu^{2+}$, $Mn^{2+}$, $ZnS:Cu^+,Cl^-$, $Ca_3WO_6:U$, $Ca_3SiO_4C_{12}:Eu^{2+}$, $Sr_xBa_yCl_zAl_2O_{4-z/2}:Ce^{3+},Mn^{2+}$ (X:0.2, Y:0.7, Z:1.1), $Ba_2MgSi_2O_7:Eu^{2+}$, $Ba_2SiO_4:Eu^{2+}$, $Ba_2Li_2Si_2O_7:Eu^{2+}$, $ZnO:S$, $ZnO:Zn$, $Ca_2Ba_3(PO_4)_3Cl:Eu^{2+}$, $BaAl_2O_4:Eu^{2+}$, $SrGa_2S_4:Eu^{2+}$, $ZnS:Eu^{2+}$, $Ba_5(PO_4)_3Cl:U$, $Sr_3WO_6:U$, $CaGa_2S_4:Eu^{2+}$, $SrSO_4:Eu^{2+},Mn^{2+}$, $ZnS:P$, $ZnS:P^{3-},Cl^-$, $ZnS:Mn^{2+}$, $CaS:Yb^{2+},Cl$, $Gd_3Ga_4O_{12}:Cr^{3+}$, $CaGa_2S_4:Mn^{2+}$, $Na(Mg,Mn)_2LiSi_4O_{10}F_2:Mn$, $ZnS:Sn^{2+}$, $Y_3Al_5O_{12}:Cr^{3+}$, $SrB_8O_{13}:Sm^{2+}$, $MgSr_3Si_2O_8:Eu^{2+},Mn^{2+}$, $\alpha\text{-}SrO.3B_2O_3:Sm^{2+}$, $ZnS\text{—}CdS$, $ZnSe:Cu^+,Cl$, $ZnGa_2S_4:Mn^{2+}$, $ZnO:Bi^{3+}$, $BaS:Au,K$, $ZnS:Pb^{2+}$, $ZnS:Sn^{2+},Li^+$, $ZnS:Pb,Cu$, $CaTiO_3:Pr^{3+}$, $CaTiO_3:Eu^{3+}$, $Y_2O_3:Eu^{3+}$, $(Y,Gd)_2O_3:Eu^{3+}$, $CaS:Pb^{2+},Mn^{2+}$, $YPO_4:Eu^{3+}$, $Ca_2MgSi_2O_7:Eu^{2+},Mn^{2+}$, $Y(P,V)O_4:Eu^{3+}$, $Y_2O_2S:Eu^{3+}$, $SrAl_4O_7:Eu^{3+}$, $CaYAlO_4:Eu^{3+}$, $LaO_2S:Eu^{3+}$, $LiW_2O_8:Eu^{3+},Sm^{3+}$, $(Sr,Ca,Ba,Mg)_{10}(PO_4)_6Cl_2:Eu^{2+},Mn^{2+}$, $Ba_3MgSi_2O_8:Eu^{2+},Mn^{2+}$, $ZnS:Mn^{2+},Te^{2+}$, $Mg_2TiO_4:Mn^{4+}$, $K_2SiF_6:Mn^{4+}$, $SrS:Eu^{2+}$, $Na_{1.23}K_{0.42}Eu_{0.12}TiSi_4O_{11}$, $Na_{1.23}K_{0.42}Eu_{0.12}TiSi_5O_{13}:Eu^{3+}$, $CdS:In,Te$, $CaAlSiN_3:Eu^{2+}$, $CaSiN_3:Eu^{2+}$, $(Ca,Sr)_2Si_5N_8:Eu^{2+}$, and $Eu_2W_2O_7$.

In one embodiment, to strengthen the bonding between the cover member and the base, a stepped structure may be formed on outer side(s) of the base such that the cover member may be disposed in the stepped structure. This feature may increase a contact surface area between the cover member and the base, thereby avoiding a delamination phenomenon by the cover member and the base or the encapsulant due to heat generated by the LED.

A method of manufacturing a LED package structure of the present disclosure may include a number of steps. A base may be provided and a plurality of LEDs may be disposed on the base, with the plurality of LEDs forming an array of LEDs. An encapsulant may be disposed on the base to cover the plurality of LEDs. The encapsulant may be cut row-wise or column-wise with respect to the array of LEDs to form a plurality of parallel slots with each of the slots cutting into a surface of the base. A plastic material may be filled into the slots. The encapsulant and the base may be cut to form a plurality of individual LED package structures. The plastic material may form a cover member of each of the plurality of LED package structures.

A light emitting diode (LED) package structure comprising an LED and an encapsulant is provided. The LED is capable of emitting a light. The encapsulant is encapsulating the LED. The encapsulant is comprising a first surface and a second surface. The light has a first light intensity after passing through the first surface of the encapsulant. The light has a second light intensity after passing through the second surface of the encapsulant. The first light intensity is different from the second light intensity. The first light intensity is smaller than the second light intensity.

In view of the above, in an LED package structure in accordance with the present disclosure, the intensity (e.g., first light intensity) of the light passing through a surface parallel to the surface of the base may be greater than the intensity (e.g., second light intensity) of the light passing through a surface perpendicular to the surface of the base. Accordingly, the LED package structure may emit light with relatively greater intensity in particular direction(s) such that the light emitted by the LED package structure may be more efficiently transmitted corresponding to the environment of its installation.

To facilitate better understanding of the above-described features and benefits, detailed description of select embodiments of the present disclosure is provided below with reference to associated figures.

BRIEF DESCRIPTION OF THE DRAWINGS

The accompanying drawings are included to provide a further understanding of the disclosure, and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED EMBODIMENTS

Figure 1:
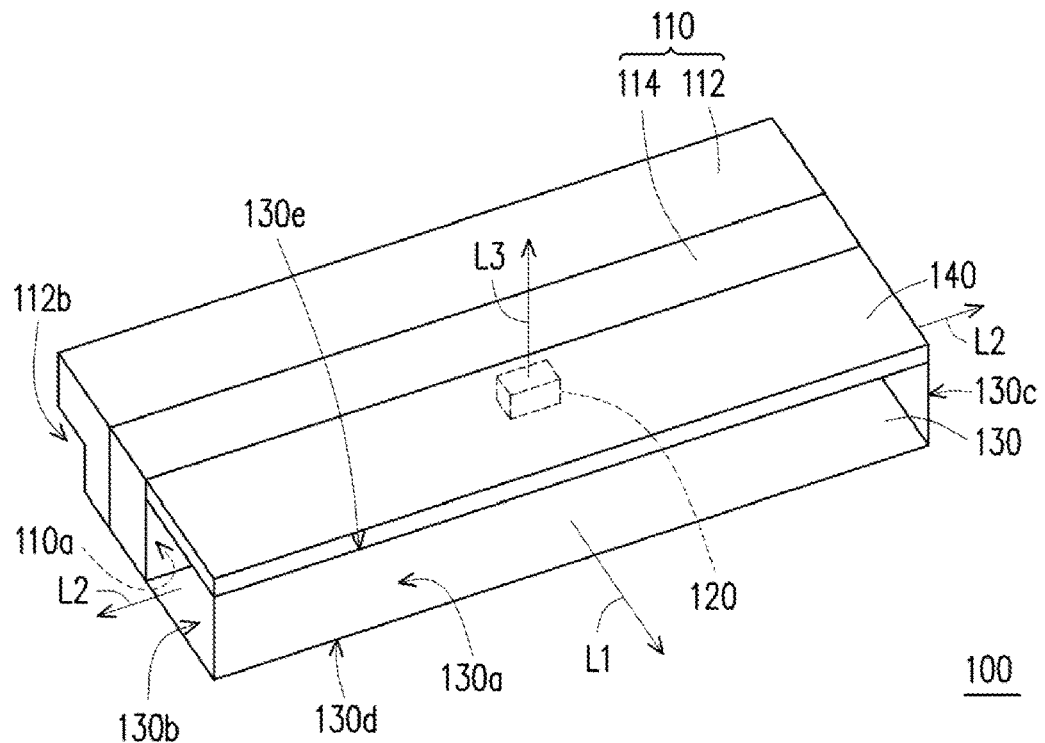
FIG. 1 is a perspective view of a LED package structure in accordance with an embodiment of the present disclosure.
Figure 2:
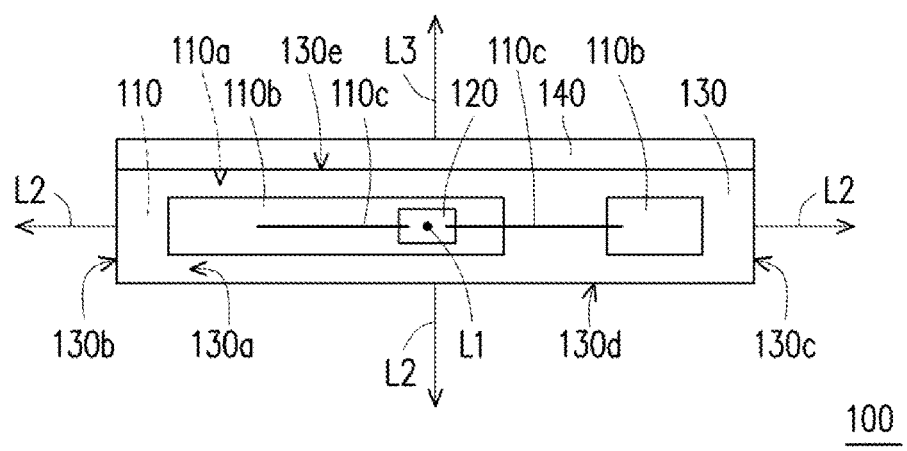
FIG. 2 is a front view of the LED package structure of FIG. 1.
Figure 3:
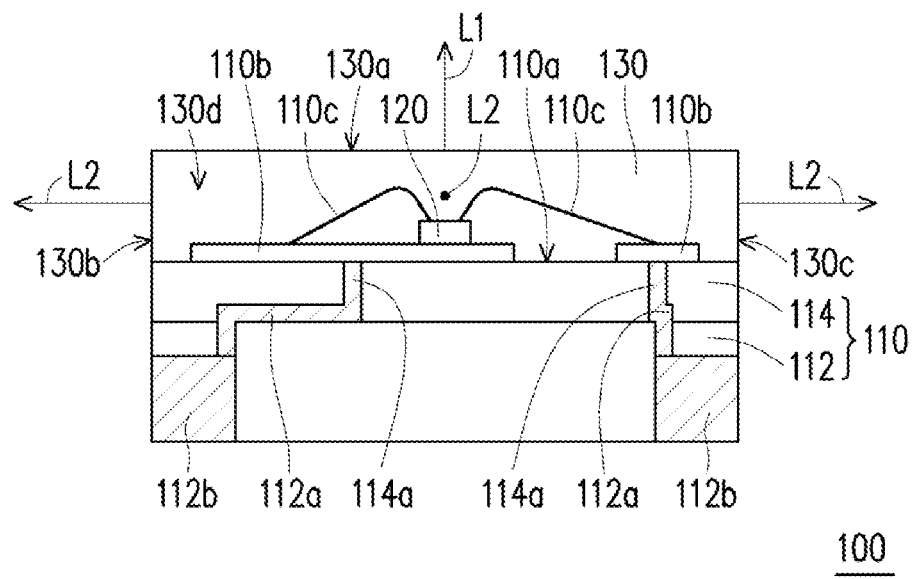
FIG. 3 is a partial cross-sectional view of the LED package structure of FIG. 1.

FIG. 1 illustrates a perspective view of a LED package structure in accordance with an embodiment of the present disclosure. FIG. 2 illustrates a front view of the LED package structure of FIG. 1. FIG. 3 illustrates a partial cross-sectional view of the LED package structure of FIG. 1. Referring to FIG. 1-FIG. 3, in one embodiment, an LED package structure 100 may include a base (or substrate) 110, an LED 120 and an encapsulant 130. The LED 120 may be disposed on a surface 110a of base 110 and capable of emitting light. Encapsulant 130 may be disposed on base 110 and covering LED 120. In one embodiment, LED 120 may be, for example, a Lambertian light source.

Encapsulant 130 may have a surface 130a that is parallel with surface 110a of base 110, as well as a number of surfaces 130b, 130c, 130d and 130e that are perpendicular to surface 110a of base 110. The light emitted by LED 120 may have a first light intensity (denoted as light L1) after passing through the surface 130a that is parallel with surface 110a of base 110. The light emitted by LED 120 may have a second light intensity (denoted as light L2) after passing through the surfaces 130b, 130c, 130d and 130e that are perpendicular to surface 110a of base 110, with the first light intensity greater than the second light intensity. In one embodiment, light emitted by LED 120 may be directional, and the first light intensity may be greater than the second light intensity due to the directionality of the light emitted by LED 120 of LED package structure 100. In one embodiment, the surfaces 130b and 130c of the encapsulant 130 are parallel. The surfaces 130d and 130e of the encapsulant 130 are parallel. The surfaces 130b and 130c of the encapsulant 130 are connected to the surfaces 130d and 130e of the encapsulant 130. In one embodiment, the light passing through the surfaces 130b, 130c, 130d and 130e of the encapsulant 130 may have different light intensity.

In addition, in one embodiment, LED package structure 100 may also include a cover member 140 disposed on surface 130e of encapsulant 130, which is perpendicular to surface 110a of base 110. The light emitted by LED 120 may have a third light intensity (denoted as light L3) after passing through cover member 140. A light transmittance of cover member 140 may be lower than a light transmittance of encapsulant 130, and the third light intensity may be less than the second light intensity. In some embodiments, cover member 140 may be formed, for example and without limitation, by spraying, sputtering, die stamping or sand polishing. In one embodiment, encapsulant 130 may be a rectangular cuboid, and may have sides through which the light having the first light intensity, the light having the second light intensity and the light having the third light intensity are transmitted in directions that are mutually perpendicular, as shown in FIG. 1-FIG. 3. It is to be noted that the shape of the encapsulant 130 is not limited thereto. From the right side view of FIG. 1, the shape of the cover member 140 and the second substrate 114 is "L" shape. The shape of the first substrate 112 and the second substrate 114 is "L" shape. The shape of the cover member 140 and the base 110 is "T" shape.

By the above-described configuration, intensity of the light emitted by LED 120 after passing through surface 130a that is parallel with surface 110a of base 110 (which is the aforementioned first light intensity) may be greater than intensity of the light emitted by LED 120 after passing through surfaces 130b, 130c and 130d that are perpendicular to surface 110a of base 110 (which is the aforementioned second light intensity). Additionally, intensity of the light emitted by LED 120 after passing through surfaces 130b, 130c and 130d that are perpendicular to surface 110a of base 110 (which is the aforementioned second light intensity) may be greater than intensity of the light emitted by LED 120 after passing through cover member 140 (which is the aforementioned third light intensity). Accordingly, LED package structure 100 may emit light of relatively greater intensity in certain directions, and this allows the light emitted by LED package structure 100 to be more efficiently transmitted corresponding to the environment of its installation.

Figure 4:
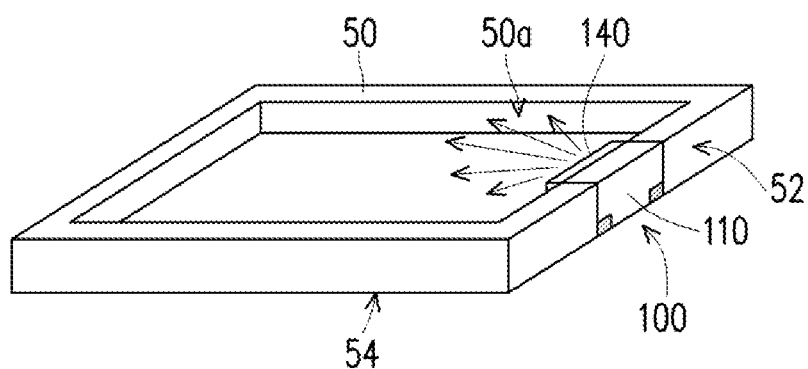
FIG. 4 is a structural view of an application of the LED package structure of FIG. 1 to guide light for buttons of an electronic device.

FIG. 4 illustrates a structural view of an application of the LED package structure of FIG. 1 to guide light for buttons of an electronic device. As an example, LED package structure 100 may be embedded in a side 52 of a light-guiding structure 50 inside a button, rather than a bottom 54 of light-guiding structure 50, to reduce the overall thickness of a combination of light-guiding structure 50 and LED package structure 100. As mentioned above, LED package structure 100 may be configured to emit light of relatively greater intensity in certain directions. This design allows the light emitted by LED package structure 100 to be more efficiently transmitted horizontally to multiple reflective surfaces 50a on inner surfaces of light-guiding structure 50, thereby achieving an optimal glowing effect by reflective surfaces 50a reflecting the emitted light, to provide desirable light emitting capability for the button. In some other embodiments, LED package structure 100 may be implemented in other types of devices or components without limitation.

Referring to FIG. 3, in one embodiment, surface 110a of base 110 may include two pads 110b. LED 120 may be disposed on one of the pads 110b and electrically connected to the two pads 110b via conductive wires 110c. Each of the two pads 110b may be connected to a corresponding terminal 112b via a respective electrically-conductive through hole 114a and a circuit layer 112a. The shape of each terminal 112b may be in a semi-through hole shape. Moreover, in one embodiment, base 110 may include a first substrate 112 and a second substrate 114 stacked on first substrate 112. Before first substrate 112 and second substrate 114 are bonded together, circuit layer 112a may be first formed on first substrate 112, and electrically-conductive through holes 114a may be formed in second substrate 114. Electrically-conductive through holes 114a and circuit layer 112a may be connected when first substrate 112 and second substrate 114 are bonded together. Accordingly, there is no need to form circuit layer 112a on surface 110a of base 110, and this saves configuration space on surface 110a. In one embodiment, the LED 120 is electrically connected to the pads 110b by flip chip bonding. In one embodiment, the LED 120 is electrically connected to one pad 110b by electrically conductive adhesive layer and electrically connected to another pad 110b by electrically conductive wire bonding.

Figure 5:
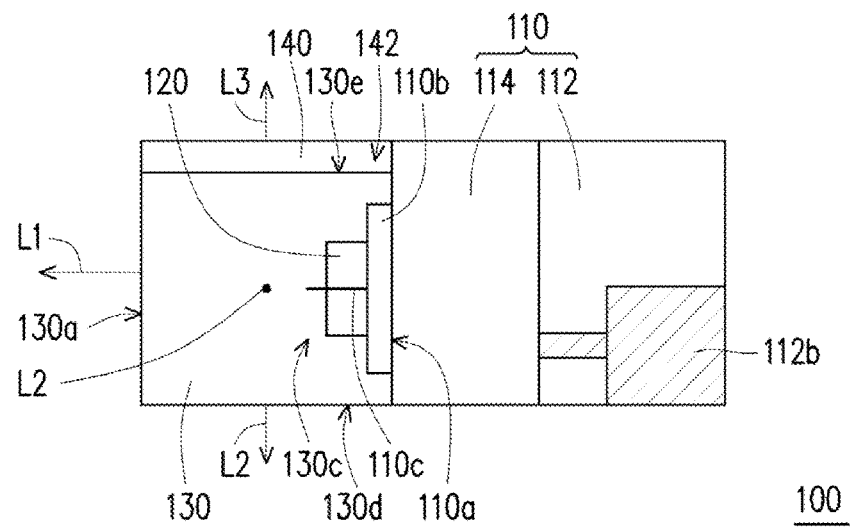
FIG. 5 is a side view of the LED package structure of FIG. 1.
Figure 6:
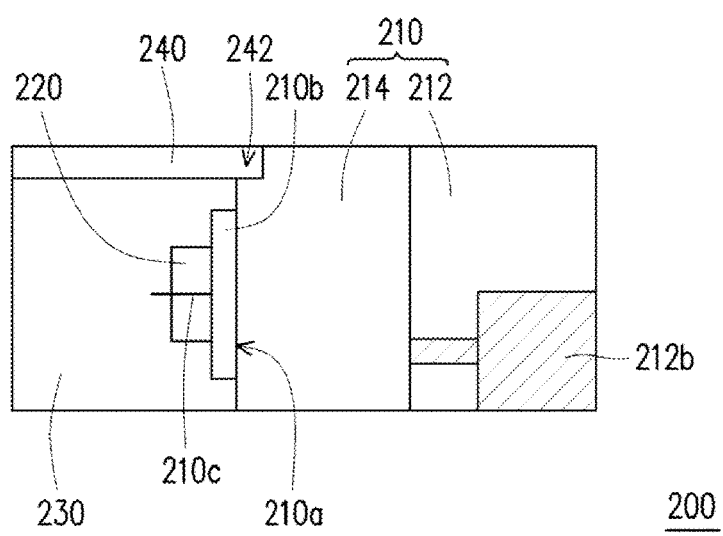
FIG. 6 is a side view of a LED package structure in accordance with another embodiment of the present disclosure.

FIG. 5 illustrates a side view of the LED package structure of FIG. 1. Referring to FIG. 5, in one embodiment, an end 142 of cover member 140 is not cut into surface 110a of base 110. Nevertheless, various embodiments of the present disclosure are not limited to what is illustrated in FIG. 5, and an alternative example is shown in FIG. 6. FIG. 6 illustrates a side view of a LED package structure 200 in accordance with another embodiment of the present disclosure. As shown in FIG. 6, LED package structure 200 may include a base (or substrate) 210, a pad 210b, an electrically-conductive wire 210c, a first substrate 212, a second substrate 214, a terminal 212b, an LED 220, an encapsulant 230, a cover member 240, the configurations and operations of which may be similar to those of base 110, pad 110b, electrically-conductive wire 110c, first substrate 112, second substrate 114, terminal 112b, LED 120, encapsulant 130 and cover member 140 of FIG. 5. In the interest of brevity, a detailed description thereof is not provided so as to avoid redundancy.

LED package structure 200 differs from LED package structure 100 in that an end 242 of cover member 240 may at least partially cut into a surface 210a of base 210. In particular, before LED package structure 200 and encapsulant 230 are cut into individual units, encapsulant 230 may first be cut to form slots for disposing cover member 240. Such slots may be cut into surface 210a of base 210. Accordingly, cover member 240 thus formed may cut into surface 210a of base 210 as shown in FIG. 6.

Figure 7:
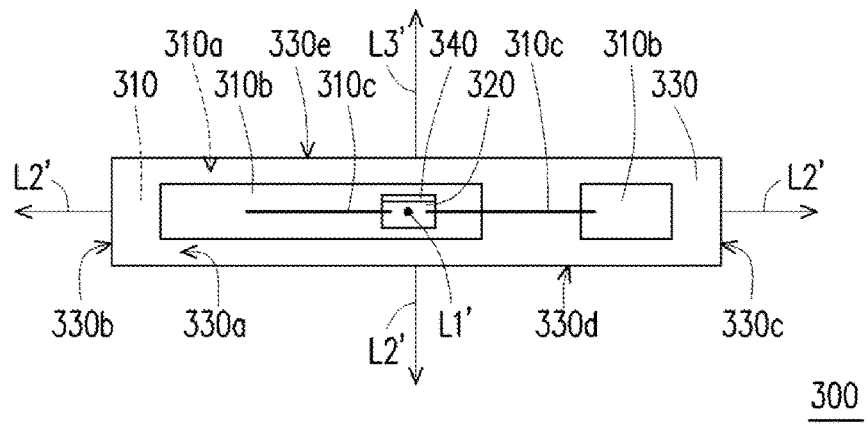
FIG. 7 is a front view of a LED package structure in accordance with another embodiment of the present disclosure.

FIG. 7 illustrates a front view of a LED package structure 300 in accordance with another embodiment of the present disclosure. As shown in FIG. 7, LED package structure 300 may include a base (or substrate) 310, a surface 310a, a pad 310b, an electrically-conductive wire 310c, an LED 320, an encapsulant 330, and surfaces 330a, 330b, 330c, 330d and 330e, the configurations and operations of which may be similar to those of base 110, surface 110a, pad 110b, electrically-conductive wire 110c, LED 120, encapsulant 130, and surfaces 130a, 130b, 130c, 130d and 130e of FIG. 2. In the interest of brevity, a detailed description thereof is not provided so as to avoid redundancy.

LED package structure 300 differs from LED package structure 100 in that cover member 340 is disposed on surface 320a of LED 320 that is perpendicular to surface 310a of base 310. Similar to the relationship between the first, second and third light intensities in the example shown in FIG. 2, in one embodiment as shown in FIG. 7, the emitted light may have a third light intensity (denoted as light L3') after passing through cover member 340 and surface 330e of encapsulant 330, which may be less than a second light intensity (denoted as light L2') of the light after passing through surfaces 330b, 330c and 330d that are perpendicular to surface 310a of base 310, in addition to being less than a first light intensity (denoted as light L1') of the light after passing through surface 330a that is parallel with surface 310a of base 310. In some other embodiments and without limitation, cover member 340 may be disposed at any suitable location between surface 320a of LED 320, which is perpendicular to surface 310a of base 310, and surface 330e of encapsulant 330, which corresponds to surface 320a. In one embodiment, the surfaces 330b and 330c of the encapsulant 330 are parallel. The surfaces 330d and 330e of the encapsulant 330 are parallel. The surfaces 330b and 330c of the encapsulant 330 are connected to the surfaces 330d and 330e of the encapsulant 330. In one embodiment, the light passing through the surfaces 330b, 330c, 330d and 330e of the encapsulant 330 may have different light intensity.

Figure 8:
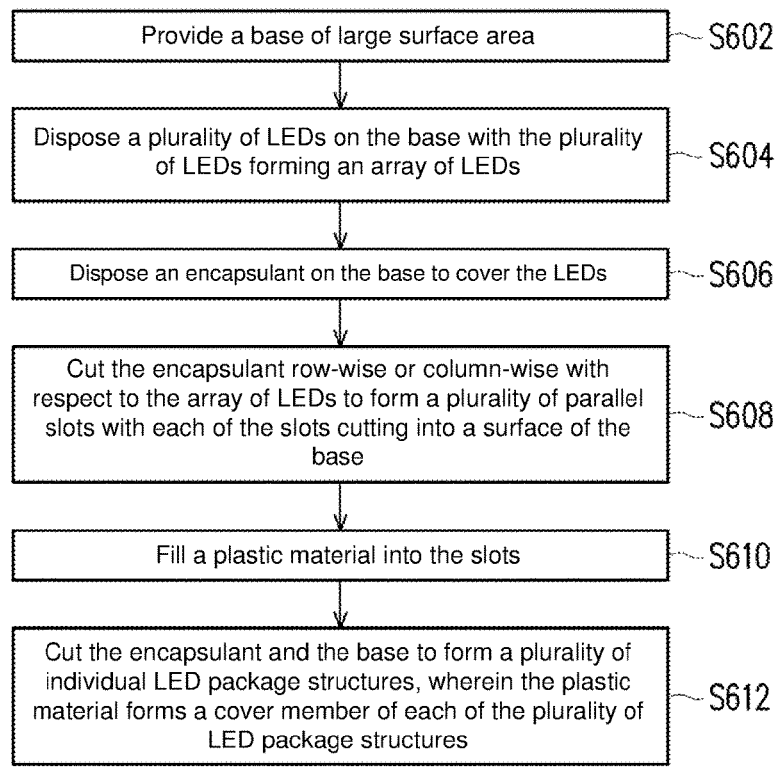
FIG. 8 is a flowchart of a process for manufacturing a LED package structure in accordance with an embodiment of the present disclosure.

Turning now to an embodiment of the present disclosure related to the manufacturing method of LED package structures. FIG. 8 illustrates a flowchart of a process for manufacturing a LED package structure in accordance with an embodiment of the present disclosure. Referring to FIG. 8, firstly, a base having a large surface area is provided (step S602). Then, a plurality of LEDs are disposed on the base, with the plurality of LEDs forming an array of LEDs (step S604). An encapsulant is disposed on the base to cover the plurality of LEDs (step S606). The encapsulant is cut in a row-wise or column-wise fashion with respect to the array of LEDs to form a plurality of parallel slots, with each of the slots cutting into a surface of the base (step S608). A plastic material is filled into the slots (step S610). The encapsulant and the base are cut to form a plurality of individual LED package structures, with the plastic material forming a cover member of each of the plurality of LED package structures (step S612). To enhance the strength of connection between the cover member and the surface of the base, the cover member may at least partially cut into the surface of the base.

In view of the above, in an LED package structure in accordance with embodiments of the present disclosure, the intensity of the light emitted by the LED may, after passing through a surface parallel with the surface of the base (e.g., the above-described first light intensity), be greater than the intensity of the light after passing through a surface perpendicular to the surface of the base (e.g., the above-described second light intensity). Moreover, the intensity of the light after passing through a surface perpendicular to the surface of the base (e.g., the above-described second light intensity) may be greater than the intensity of the light after passing through the cover member (e.g., the above-described third light intensity). Accordingly, light emitted by the LED package structure may have relatively greater light intensity in certain directions, and this allows the light emitted by LED package structure 100 to be more efficiently transmitted corresponding to the environment of its installation.

In view of the above, select embodiments in accordance with the present disclosure are highlighted provided below.

In one aspect, an LED package structure may include a base, an LED disposed on a first surface of the base and capable of emitting a light, and an encapsulant disposed on the base and encapsulating the LED. The encapsulant may include a second surface parallel to the first surface of the base and a plurality of third surfaces perpendicular to the first surface of the base. The light may have a first light intensity after passing through the second surface of the encapsulant parallel to the first surface of the base. The light may have a second light intensity after passing through the third surfaces of the encapsulant perpendicular to the first surface of the base. The first light intensity may be greater than the second light intensity.

The LED package structure may also include a cover member disposed on at least one of the plurality of third surfaces of the encapsulant perpendicular to the first surface of the base. The light may have a third light intensity after passing through the cover member. The third light intensity may be less than the second light intensity. In some implementations, the cover member may be formed by spraying, sputtering, die stamping or sand polishing. In some implementations, a light transmittance of the cover member may be lower than a light transmittance of the encapsulant. In some implementations, one end of the cover member may at least partially cut into the surface of the base. In some implementations, the light having the first light intensity, the light having the second light intensity and the light having the third light intensity may be in directions that are mutually perpendicular.

The LED package structure may also include a cover member disposed on at least one fourth surface of the LED perpendicular to the first surface of the base and one of the third surfaces of the encapsulant. The light may have a third light intensity after passing through the cover member. The third light intensity may be less than the second light intensity. In some implementations, the cover member may be formed by spraying, sputtering, die stamping or sand polishing. In some implementations, a light transmittance of the cover member may be lower than a light transmittance of the encapsulant. In some implementations, one end of the cover member may at least partially cut into the surface of the base. In some implementations, the light having the first light intensity, the light having the second light intensity and the light having the third light intensity may be in directions that are mutually perpendicular.

The LED package structure may further include a cover member disposed on at least one fourth surface of the LED perpendicular to the first surface of the base. The light may have a third light intensity after passing through the cover member. The third light intensity may be less than the second light intensity. In some implementations, the cover member may be formed by spraying, sputtering, die stamping or sand polishing. In some implementations, a light transmittance of the cover member may be lower than a light transmittance of the encapsulant. In some implementations, one end of the cover member may at least partially cut into the surface of the base. In some implementations, the light having the first light intensity, the light having the second light intensity and the light having the third light intensity may be in directions that are mutually perpendicular.

In another aspect, a method of manufacturing LED package structure may involve a number of operations, including: providing a base; disposing a plurality of LEDs on the base with the plurality of LEDs forming an array of LEDs; disposing an encapsulant on the base to cover the plurality of LEDs; cutting the encapsulant row-wise or column-wise with respect to the array of LEDs to form a plurality of parallel slots with each of the slots cutting into a surface of the base; filling a plastic material into the slots; and cutting the encapsulant and the base to form a plurality of individual LED package structures, wherein the plastic material forms a cover member of each of the plurality of LED package structures.

In another aspect, an LED package structure may include an LED capable of emitting a light, and an encapsulant encapsulating the LED. The encapsulant may include a first surface and a second surface. The light may have a first light intensity after passing through the first surface of the encapsulant. The light may have a second light intensity after passing through the second surface of the encapsulant. The first light intensity may be different from the second light intensity.

In some implementations, the first light intensity may be greater than the second light intensity. Alternatively, the first light intensity may be smaller than the second light intensity.

Although select embodiments of the present disclosure have been described above, they are not intended to limit the scope of the present disclosure. One of ordinary skill in the art may, without departing from the spirit and scope of the present disclosure, make modifications and variations based on the present disclosure. Thus, the scope of protection of the present disclosure ought to be defined by the claims that follow.

What is claimed is:

1. A light emitting diode (LED) package structure, comprising:
   a base including a first substrate and a second substrate stacked on the first substrate, wherein the first substrate and the second substrate form an "L" shape in a side view;
   an LED disposed on a first surface of the base and capable of emitting a light;
   an encapsulant disposed on the base and encapsulating the LED,
   wherein the encapsulant has a second surface parallel to the first surface of the base and a plurality of third surfaces perpendicular to the first surface of the base; and
   a cover member disposed on at least one of the plurality of third surfaces of the encapsulant, wherein the cover member and the base form a "T" shape in the side view with the cover member forming a part of the "T" shape,
   wherein each of the first substrate and the second substrate has a top surface and a bottom surface which are perpendicular to the first surface of the base, wherein a top surface of the cover member, the top surface of the first substrate and the top surface of the second substrate are coplanar, and wherein one of the plurality of third surfaces, the bottom surface of the first substrate and the bottom surface of the second substrate are coplanar,
   wherein the light has a first light intensity after passing through the second surface of the encapsulant parallel to the first surface of the base,
   wherein the light has a second light intensity after passing through the third surfaces of the encapsulant perpendicular to the first surface of the base, and
   wherein the first light intensity is greater than the second light intensity.

2. The LED package structure of claim 1, wherein the light has a third light intensity after passing through the cover member and exiting the top surface of the cover member, and wherein the third light intensity is less than the second light intensity.

3. The LED package structure of claim 2, wherein the cover member is formed by spraying, sputtering, die stamping or sand polishing.

4. The LED package structure of claim 2, wherein a light transmittance of the cover member is lower than a light transmittance of the encapsulant.

5. The LED package structure of claim 2, wherein the light having the first light intensity, the light having the second light intensity and the light having the third light intensity are in directions that are mutually perpendicular.

6. A light emitting diode (LED) package structure, comprising:
   a base including a first substrate and a second substrate stacked on the first substrate, wherein the first substrate and the second substrate form an "L" shape in a side view;
   an LED disposed on a first surface of the base and capable of emitting a light;
   an encapsulant encapsulating the LED,
   wherein the encapsulant comprising a first surface, a second surface, a third surface and a fourth surface;
   a cover member disposed on the third surface of the encapsulant, wherein the cover member and the base form a "T" shape in the side view with the cover member forming a part of the "T" shape,
   wherein each of the first substrate and the second substrate has a top surface and a bottom surface which are perpendicular to the first surface of the base, wherein a top surface of the cover member, the top surface of the first substrate and the top surface of the second substrate are coplanar, and wherein the fourth surface of the encapsulant, the bottom surface of the first substrate and the bottom surface of the second substrate are coplanar,
   wherein the light has a first light intensity after passing through the first surface of the encapsulant,
   wherein the light has a second light intensity after passing through the second surface of the encapsulant, and
   wherein the first light intensity is different from the second light intensity.

7. The LED package structure of claim 6, wherein the first light intensity is greater than the second light intensity.

8. The LED package structure of claim 6, wherein the first light intensity is smaller than the second light intensity.

* * * * *